United States Patent [19]
Gupta

[11] Patent Number: 5,379,359
[45] Date of Patent: Jan. 3, 1995

[54] LASER DIODE COUPLING TO WAVEGUIDE AND METHOD OF MAKING SAME USING SUBSTRATE ETCHING

[75] Inventor: Mool C. Gupta, Webster, N.Y.

[73] Assignee: Eastman Kodak Company, Rochester, N.Y.

[21] Appl. No.: 953,459

[22] Filed: Sep. 29, 1992

[51] Int. Cl.⁶ .......................... G02B 6/12; H01L 21/70
[52] U.S. Cl. .......................... 385/49; 385/14; 385/129; 385/130; 437/15; 437/51; 437/225
[58] Field of Search .............. 385/14, 31, 38, 49, 385/50, 52, 129, 130, 131, 132; 437/15, 51, 126, 129, 225, 233

[56] References Cited

U.S. PATENT DOCUMENTS

| | | | |
|---|---|---|---|
| 4,768,199 | 8/1988 | Heinen et al. | 385/49 |
| 4,828,358 | 5/1989 | Blonder | 385/38 |
| 4,883,743 | 11/1989 | Booth et al. | 385/51 X |
| 4,969,712 | 11/1990 | Westwood et al. | 385/49 |
| 4,973,133 | 11/1990 | Matz et al. | 385/49 |
| 5,046,808 | 9/1991 | Chang | 385/49 |
| 5,103,493 | 4/1992 | Buchmann et al. | 385/14 |
| 5,121,457 | 6/1992 | Foley et al. | 385/49 |
| 5,159,700 | 10/1992 | Reid et al. | 385/14 |
| 5,222,162 | 6/1993 | Yap et al. | 385/14 |
| 5,259,049 | 11/1993 | Bona et al. | 385/51 X |

Primary Examiner—Brian Healy
Attorney, Agent, or Firm—Raymond L. Owens

[57] ABSTRACT

A method of making an optical device including a semiconductor laser and a waveguide optically coupled to the laser, includes the steps of providing a substrate formed from a material on which a semiconductor laser can be created; sequentially creating a plurality of layers of relatively different impurity types and concentrations on the substrate, to form a laser structured region; forming a first mirror at one edge of the laser structured region; removing a portion of the laser structured region opposite the one edge by etching the region to a preselected depth selected so that a waveguide mounted on the substrate in the etched region is vertically aligned with a light emitting portion of the laser structured region; and forming a second mirror on the edge of the laser structured region opposite the first edge and adjacent the etched portion. A waveguide structure mounted on the etched surface of the substrate adjacent the laser diode can be very efficiently coupled to the laser diode by aligning it only in the horizontal direction, which is not as critical as the vertical alignment.

16 Claims, 3 Drawing Sheets

LASER DIODE COUPLING TO WAVEGUIDE AND METHOD OF MAKING SAME USING SUBSTRATE ETCHING

BACKGROUND OF THE INVENTION

1. Field of the Invention

This invention relates generally to semi-conductor laser diode-waveguide combinations and more particularly to a construction for a laser diode or waveguide that facilitates accurate coupling of the laser diode with a waveguide device.

2. Description of the Related Art

Semiconductor laser diodes emit light from an area that is usually less than one micron in thickness and a few microns wide. The light beam emitted by a laser diode is normally highly divergent, typically 10 to 30 degrees. There is a need for way to couple light from such a semiconductor laser diode to a waveguide or similar device that is itself no more than a few microns thin and several microns wide in cross section. For convenience, we will use the term "waveguide" to refer not only to waveguides per se, but also to other optical or electro optical devices having similar physical characteristics, including, for example, frequency converters, modulators, beam deflectors and the like.

The efficiency of coupling between a laser diode and a waveguide is critically dependent upon the accuracy with which the laser diode and waveguide are aligned, especially their vertical alignment. Heretofore, laser diodes and waveguides have been formed as separately discrete structures and mechanically aligned, for example, by edge coupling, prison coupling, or grating coupling. Edge coupling can be particularly efficient and a number of related approaches have been used, including physically placing a laser diode against the waveguide, or coupling the light to an optical fiber and then edge coupling the fiber to the waveguide, or focusing the laser beam from the fiber on the edge of the waveguide. All of these methods require accurate alignment of the light source, be it the laser diode or the optical fiber, with the waveguide, in three directions. Because of the critical dependence of coupling efficiency on accuracy of alignment, alignment to better than 0.1 micron accuracy is desirable.

SUMMARY OF THE INVENTION

This invention relates to a structure and method for making a semiconductor laser diode or waveguide that substantially simplifies alignment of the diode with the waveguide in the vertical direction, that is, perpendicular to the planes of the layers of the laser diode. Briefly stated, and in accordance with a presently preferred embodiment of the invention, a method of making an optical device including a semiconductor laser and a waveguide optically coupled to the laser, includes the steps of providing a substrate formed from a material on which a semiconductor laser can be created; sequentially creating a plurality of layers of relatively different impurity types and concentrations on the substrate, to form a laser structured region; forming a first mirror at one edge of the laser structured region; removing a portion of the laser structured region opposite the one edge by etching the region to a preselected depth selected so that a waveguide mounted on the substrate in the etched region is vertically aligned with a light emitting portion of the laser structured region; and forming a second mirror on the edge of the laser structured region opposite the first edge and adjacent the etched portion. A waveguide structure mounted on the etched surface of the substrate adjacent the laser diode can be very efficiently coupled to the laser diode by aligning it only in the horizontal direction, which is not as critical as the vertical alignment.

In accordance with an analogous alternative embodiment of this invention, a waveguide substrate is provided, a waveguide is formed on a first major surface of the substrate by diffusion or by epitaxial growth or the like, and a recess is formed adjacent to one end of the waveguide by etching, preferably anisotropically etching through the top layer of the waveguide to the substrate to form a mounting surface on the substrate. The depth of the etch can be very accurately controlled. A laser diode is mounted on the etched surface and is precisely aligned with the substrate in a vertical direction by virtue of the accuracy of the depth of the etch.

The novel aspects of the invention are set forth with particularity in the appended claims. The invention itself, together with further objects and advantages thereof may be more readily comprehended by reference to the following detailed description of a presently preferred embodiment thereof, taken in conjunction with the accompanying drawing, in which:

DETAILED DESCRIPTION

Figure 1:
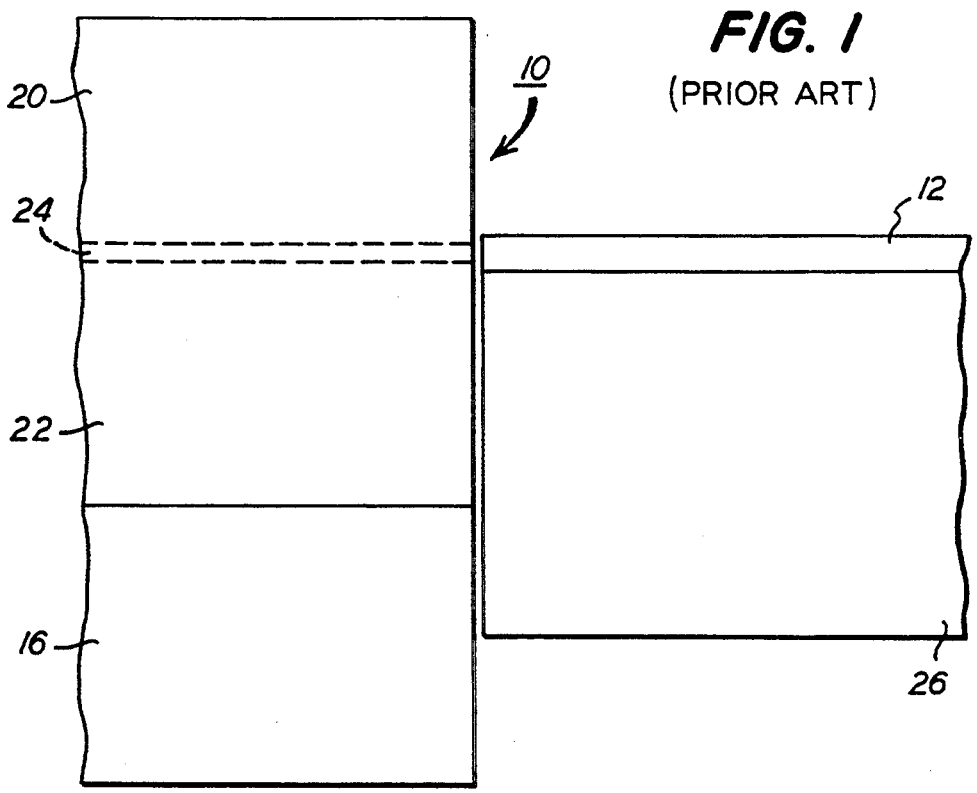
FIG. 1 is a side elevation, partially in section, of a laser diode coupled to a waveguide in accordance with the prior art.

A laser diode 10 is shown edge coupled to a waveguide 12 in FIG. 1. This figure represents the edge coupling or butt coupling technique known in the art. The semiconductor laser diode 10 is formed on a heat sink 16. Conventionally, the laser diode includes a plurality of layers, such as a p conductivity type layer 20 and an n-conductivity type layer 22. Light is emitted from the laser diode at the junction 24 between the p and n type layers. Typically, the light emitting layer is less than a micron thick, and no more than a few microns wide. The beam emitted from the light entitling layer is often highly divergent with a typical divergence angle of 10-30 degrees.

A waveguide 12 is formed on a substrate 26 of compatible material. Typically, the waveguide 12 is about a micron thick, and up to several centimeters long. The waveguide may be planar, that it is may have a relatively large width, or it may be a channel waveguide of limited width for confining the light into two dimensions.

The waveguide device may have other components on or in it. For example a waveguide can be formed by proton exchange on a lithium niobate substrate. The proton exchange is carried out by immersing the substrate in benzoic acid or phosphoric acid for about one hour at about 200 degrees C. The lithium ions go into solution and hydrogen atoms diffuse into the lithium niobate. This process raises the refractive index of the material and hence forms a waveguide that confines light in a few waveguide region a few microns thick. The waveguide can be a planar or channel waveguide. Alternatively, the waveguide device could be frequency doubling device which converts incident infrared light from a laser diode into shorter wavelength light.

Figure 2:
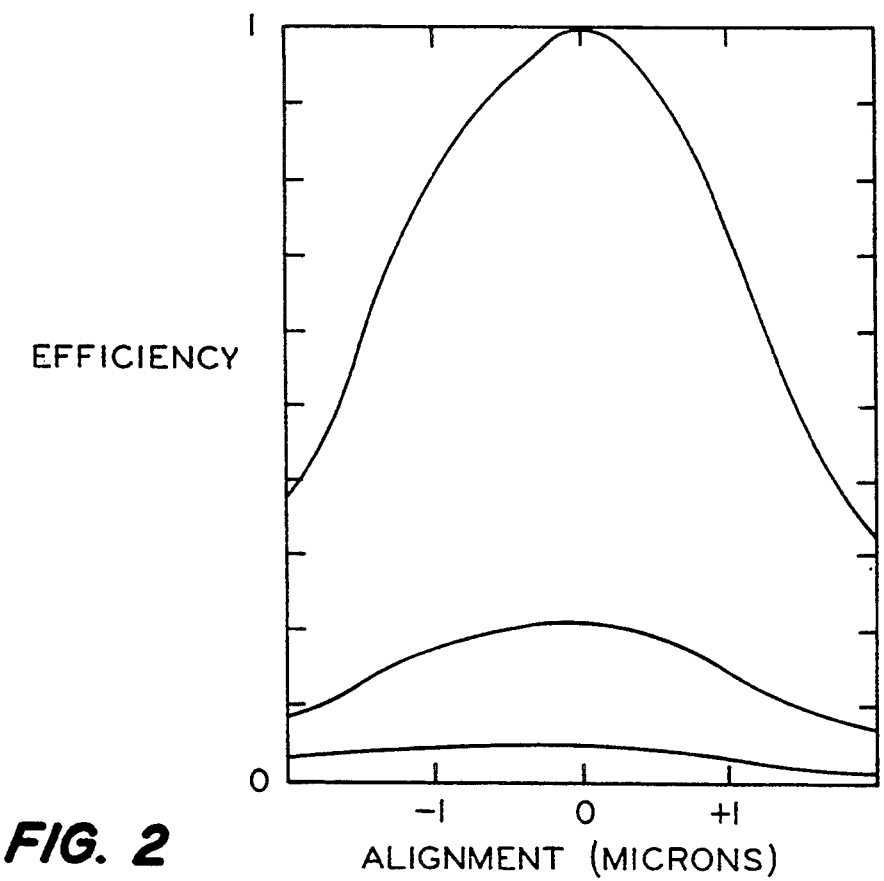
FIG. 2 is a graphical representation of the coupling efficiency as a function of the accuracy of alignment of the laser diode and waveguide in the vertical direction.

Because the light emitting layer 24 of the semiconductor laser 10 is thin, and the divergence angle is high, it is important to both closely couple the laser and the waveguide and to align the laser with the waveguide accurately, especially in a vertical direction. The relative coupling efficiency as a function of vertical deviation from ideal alignment is shown in FIG. 2. It can be seen that misalignment by one micrometer reduces coupling efficiency by 20% to 30%.

Figure 3:
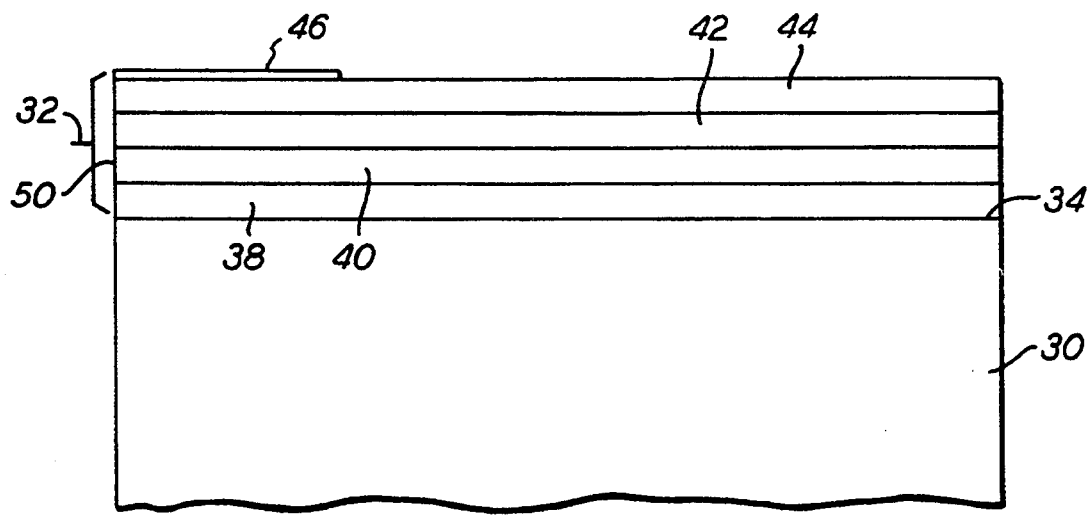
FIG. 3 is a side view of a substrate with a laser structured region formed thereon.
Figure 4:
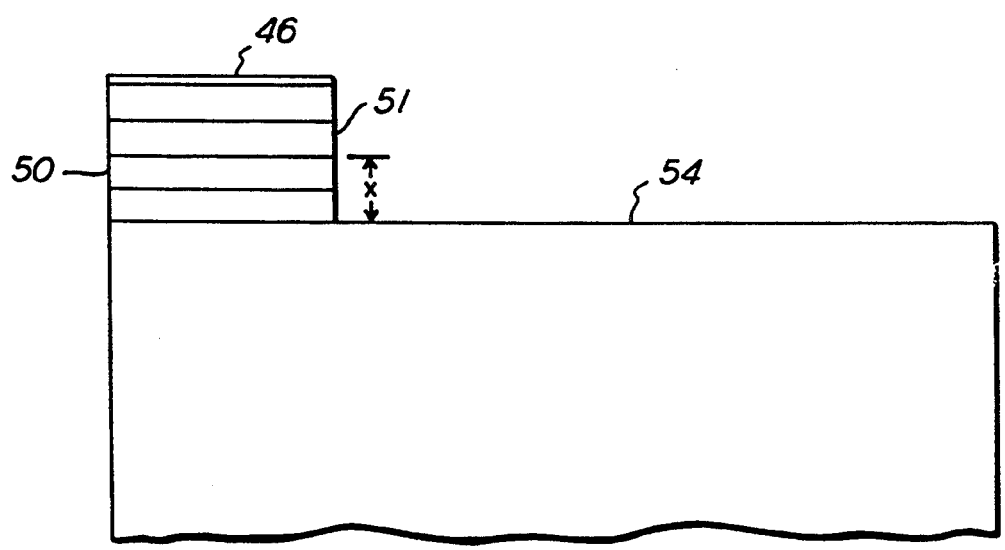
FIG. 4 shows the structure of FIG. 3 etched to receive a waveguide.
Figure 5:
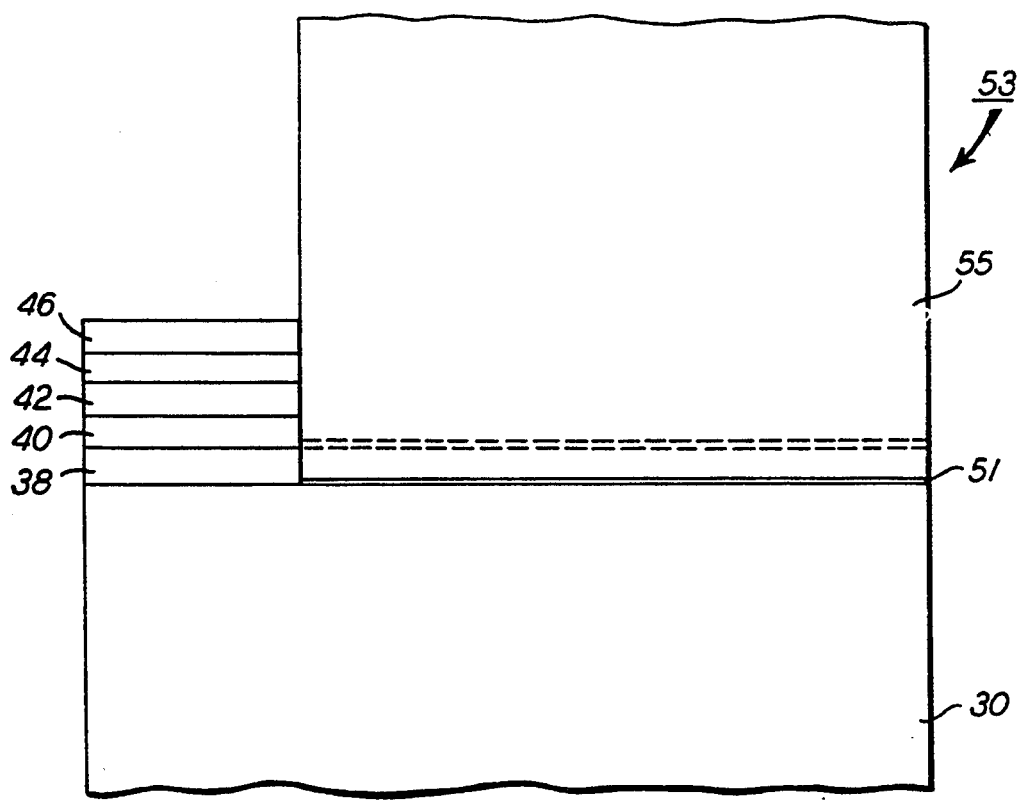
FIG. 5 is a side elevation, partly in section, of a semiconductor laser diode coupled to a waveguide in accordance with the present invention.

A structure and method for forming the structure in accordance with the present invention that facilitates accurate alignment and close spacing between a semiconductor laser diode and a waveguide is shown in FIGS. 3-5. As shown in FIG. 3, a substrate 30 such as a gallium arsenide (GaAs) substrate is provided. A layered laser diode structure 32 is formed on a surface 34 of the substrate 30. Preferably, the laser diode structure is formed by epitaxially forming a plurality of layers of semiconductor material on the substrate, the layers having relatively different impurity types and concentrations. The laser diode structure layers can be grown by well known methods such as metalo-organic chemical vapor deposition or molecular beam epitaxy. For example, an n-conductivity type aluminum gallium arsenide layer 38 followed by a p-conductivity type gallium arsenide layer 40, followed by a p-conductivity type aluminum gallium arsenide layer 42, followed by a p-conductivity type gallium arsenide layer 44, and finally a metal contact 46 are formed on the substrate. The formation of laser diode structures per se is well known, and as such forms no part of this invention. Typically, a laser beam will be emitted from the p-type gallium arsenide layer 40 close to the junction with p-type aluminum gallium arsenide layer 42.

In order to convert the laser structure to a laser, a first mirrored surface 50 is formed at one edge of the laser structure 32 by cleaving the edge, or by any other technique known to those skilled in the art, and metalizing the flat surface. As shown in FIG. 4, a second mirrored surface is formed while removing a carefully controlled portion of the laser diode structure by etching the structure for a predetermined time to produce a waveguide mounting surface 54 on the substrate 30 that is displaced by an accurately known distance X from the light emitting region of the laser diode. The etched facet 51 of the semiconductor diode laser can also be formed by reactive ion beam etching. A photoresist pattern is formed on the laser diode structure by photolithography and etching is carded out by flowing a gas such as $Cl_2$ near the surface and directing a beam of Argon ions incident on the surface. Reactive ion beam etching produces mirror quality surfaces and the details are known in the art.

Preferably, as shown in FIG. 5, a buffer layer 51 such as a layer of oxide is formed on the surface 34 and a waveguide structure 53, such as a thin film waveguide formed on a lithium tantalate ($LiTaO_3$) substrate 55 is mounted, waveguide down, on the surface 30 or on the buffer layer.

The waveguide device 53 rests on semiconductor diode laser substrate. The etching is formed to a depth that maximizes the light coupling to waveguide. The etching depths are on the order of microns. The waveguide is then mechanically aligned 16 the laser diode solely by lateral motion to optimize the light coupling to the waveguide. Vertical motion is already fixed by the etching. Then the waveguide is bonded to the substrate. Bonding can be achieved by an adhesive such as Norland optical adhesive.

An alternative to etching the diode laser structure is to photolithographically mask the part of the substrate on which the waveguide will be mounted, so that the laser diode layers can be grown on one part of substrate and the other part of substrate can be used to mount the waveguide device for efficient coupling. Because the rate of growth of the layers of the laser diode is accurately known, the distance from the mounting surface to the light emitting region of the laser diode can be precisely controlled.

Figure 6:
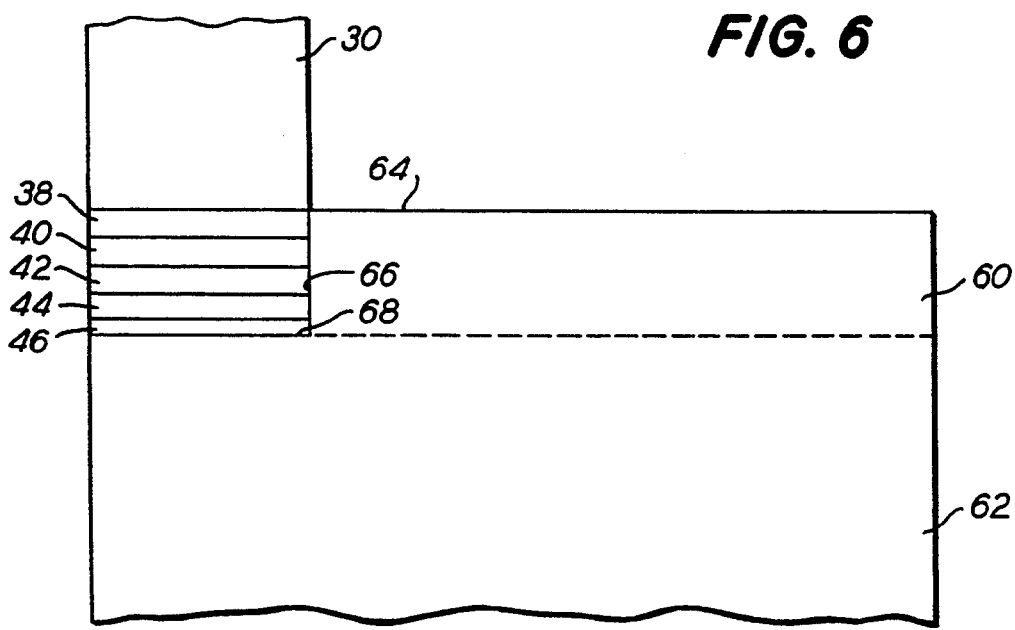
FIG. 6 is a side elevation, partly in section, of a laser diode and waveguide assembly in accordance with an alternative embodiment of this invention.

In accordance with an alternative embodiment of this invention, as shown in FIG. 6, the elements are essentially reversed. A waveguide 60 is formed by conventional means on $LiNbO_3$ substrate 62. The surface 64 of the waveguide is masked and etched to form a recess 66. A previously constructed laser diode is placed on the etched surface 68 of the substrate in the recess 66 adjacent the waveguide, so that the light emitting layer of the laser diode is vertically aligned with the waveguide.

While the invention has been described in connection with presently preferred embodiments thereof, those skilled in the art will recognize that many modifications and changes may be made therein without departing from the true spirit and scope of the invention, which accordingly is intended to be defined solely by the appended claims.

What is claimed is:

1. A method of making an optical device including a semiconductor laser and a crystalline, planar waveguide formed on a substrate, the waveguide being optically coupled to the semiconductor laser comprising:
   providing a substrate formed from a material on which a semiconductor laser can be created;
   sequentially creating a plurality of layers of relatively different impurity types and concentrations on the substrate to form a layered laser structured region;
   forming a first mirror at one edge of the laser structural region;
   removing a portion of the laser structured region opposite the one edge to form a planar surface at a preselected depth selected so that a wave guide mounted on the planar surface of the substrate is vertically aligned with a light emitting portion of the laser structured region; and
   forming a second mirror on an edge of the laser structured region opposite the first edge and adjacent the planar surface so that a planar crystalline waveguide on a substrate disposed in a waveguide down orientation on the planar surface adjacent the second mirror is aligned with the light emitting portion of the laser.

2. The method of claim 1 in which said step of removing a portion of the laser structured region opposite the one edge comprises etching the laser structured region for a preselected time to achieve the preselected depth.

3. The method of claim 2 in which said etching step comprises reactive ion beam etching.

4. The method of claim 3 in which said etching step comprises forming a photo resist pattern on the laser diode structure, flowing a gas near the surface, and directing a beam of ions incident to the surface to produce a mirror quality surface.

5. The method of claim 4 in which the gas is a chlorine gas and the beam of ions is a beam of argon ions.

6. The method of claim 2 comprising the further step of disposing a planar crystalline wave guide on the substrate, waveguide down, in the etched region adjacent to the laser structured region, the wave guide having a thickness such that the light emitting portion of the laser structured region is efficiently coupled to the waveguide.

7. The method of claim 6 in which the wave guide comprises a frequency converting device.

8. The method of claim 7 in which the frequency converting device comprises a frequency doubling device.

9. The method of claim 1 in which the wave guide is formed from a material different from the substrate on which the laser diode structure is formed.

10. An optical structure comprising:
a semiconductor substrate having a first surface;
a multilayer laser diode formed on the surface and extending upwardly therefrom and including a first mirrored surface;
a waveguide receiving recess formed in the multilayered laser diode structure adjacent to the first mirrored surface and forming a planar mounting surface;
a second mirrored surface formed adjacent the recess; and
a planar, crystalline, optical waveguide formed on a substrate and mechanically attached to the mounting surface, substrate up in the recess adjacent the second mirrored surface, the waveguide being vertically aligned with a light emitting layer of the multilayer semiconductor laser diode structure by the depth of the recess.

11. The optical structure of claim 10 in which the optical waveguide comprises a waveguide formed on a substrate and attached waveguide down in the recess.

12. The optical structure of claim 10 in which the recess extends into the substrate.

13. The optical structure of claim 10 in which the recess extends only partly through the multilayer laser diode structure.

14. The optical structure of claim 10 in which the waveguide is adhesively bonded to the multilayered laser diode structure.

15. The optical structure of claim 10 in which the optical crystalline planar wave guide comprises a frequency converting device.

16. The optical structure of claim 15 in which the frequency converting device comprises a frequency doubling device.

* * * * *